United States Patent [19]
Ishii et al.

[11] Patent Number: 5,727,688
[45] Date of Patent: Mar. 17, 1998

[54] COMPONENT HOLDER BODY

[75] Inventors: Yoshimichi Ishii, Neyagawa; Ryoichi Kamatani, Hirakata; Hiroyuki Mochizuki, Osaka, all of Japan

[73] Assignee: Matsushita Electric Industrial Co., Ltd., Kadoma, Japan

[21] Appl. No.: 745,272

[22] Filed: Nov. 8, 1996

[30] Foreign Application Priority Data

Nov. 10, 1995 [JP] Japan ................... 7-292554

[51] Int. Cl.⁶ ................................... B65D 73/02
[52] U.S. Cl. .................... 206/724; 206/714; 206/722; 206/820
[58] Field of Search .................. 206/722–728, 206/504, 560, 1.5, 480, 714, 820

[56] References Cited

U.S. PATENT DOCUMENTS

| | | | |
|---|---|---|---|
| 4,535,887 | 8/1985 | Egawa | 206/724 |
| 4,681,221 | 7/1987 | Chickanosky et al. | 206/724 |
| 4,886,239 | 12/1989 | Stimmel | 206/504 |
| 4,966,281 | 10/1990 | Kawanishi et al. | 206/714 |
| 5,333,733 | 8/1994 | Murata | 206/714 |
| 5,373,938 | 12/1994 | Kubo | 206/724 |
| 5,375,710 | 12/1994 | Hayakawa et al. | 206/724 |
| 5,526,936 | 6/1996 | Matsuzoe | 206/724 |
| 5,573,427 | 11/1996 | Sagano | 206/724 |

*Primary Examiner*—Paul T. Sewell
*Assistant Examiner*—Luan K. Bui
*Attorney, Agent, or Firm*—Wenderoth, Lind & Ponack

[57] ABSTRACT

A component holder body is provided with a component arrangement section where an installation space for a component is defined, and holding parts for holding the component arranged in the installation space. The component arrangement section is constructed so as to be shiftable between a holding position in which the component arrangement section projects and a position projecting upward from the holding position. Meanwhile, the holding parts are designed so as to shift, in association with the shift of the component arrangement section between the holding and projecting positions, between a holding posture for holding the component and a retreat posture for opening the installation space.

14 Claims, 11 Drawing Sheets

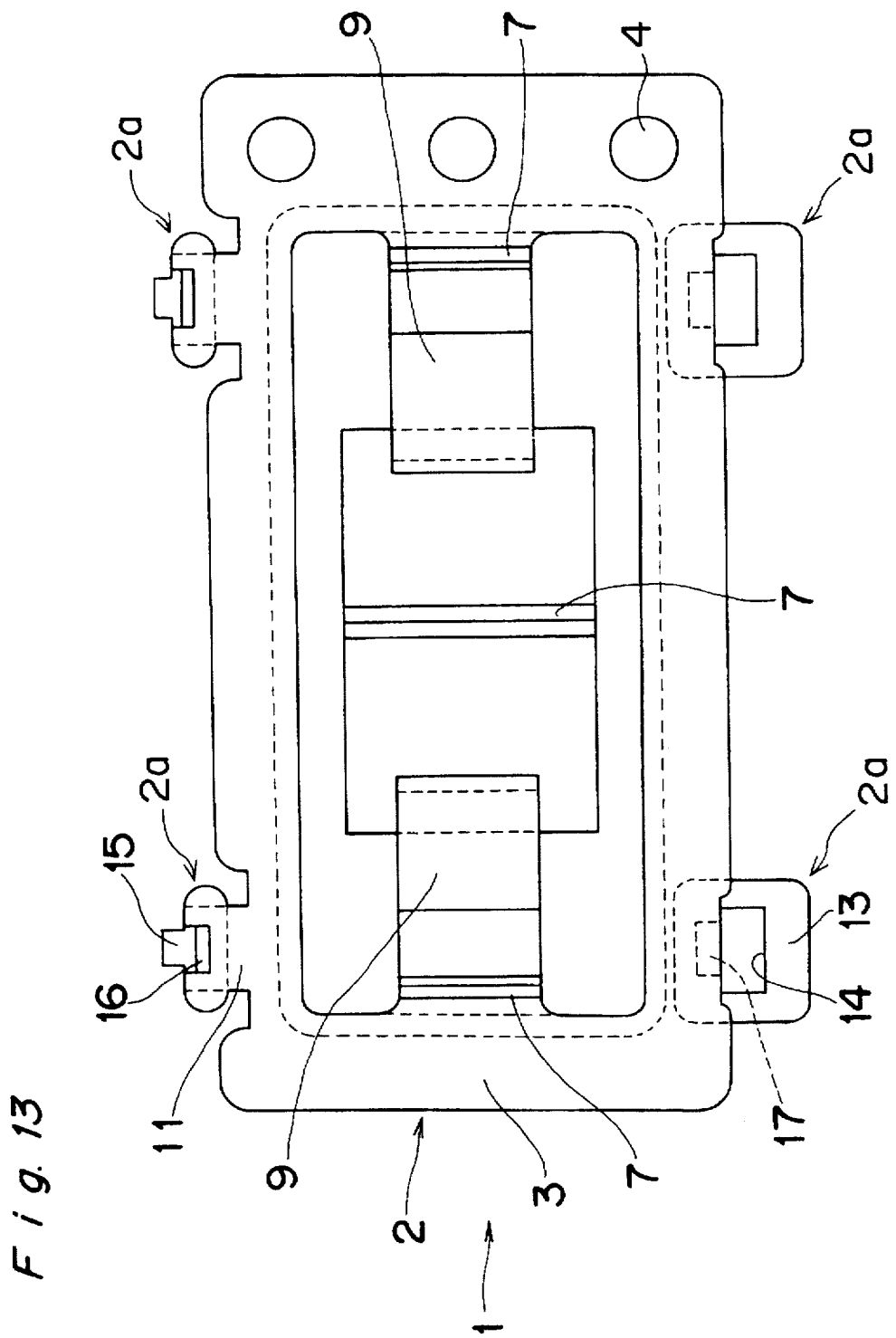

COMPONENT HOLDER BODY

BACKGROUND OF THE INVENTION

The present invention relates to a component holder body for storing/holding various kinds of components, e.g., mechanical components, electronic components, etc.

Conventionally, for holding and loading many components in a collective body to a component feed device, such a component holder body 31 as shown in FIG. 15 has been used. The holder body 31 utilizes a holding tape 32 with many storing recesses embossed every predetermined distance therein. An upper surface of the holding tape 32 after components are accommodated in the recesses 33 is covered with a cover tape 34 to prevent the components from popping out.

In the component holder body 31 as above, since the size accuracy of the recesses 33 formed by embossing cannot be high, it is impossible to surely hold the components in the recesses 33 not so they do move. If the components have soft or weak projections, the components may be subject to shock and damaged during the transfer or supply. Moreover, since it is necessary to cover the components with the cover tape 34 when the components are stored and to strip off and rewind the cover tape 34 when the components are supplied, the component feed device becomes complicated in structure. The stripped cover tape 34 is dumped, not recycled, thus inviting an increase of costs.

SUMMARY OF THE INVENTION

Accordingly, an object of the present invention is to provide a component holder body which can surely hold components and is wholly reusable.

In accomplishing these and other aspects, according to a first aspect of the present invention, there is provided a component holder body comprising:

a component arrangement section defining an installation space for a component; and holding parts for holding the component set in the installation space, wherein the component arrangement section is constructed so as to be shiftable between a holding position and a projecting position projecting upward from the holding position, while the holding parts are designed to shift, in association with a shift of the component arrangement section between the holding and projecting positions, between a holding posture for holding the component and a retreat posture for opening the installation space up.

According to the arrangements, when the arrangement section is shifted to the projecting position thereby to retreat the holding parts, the component is disposed in the arrangement section from above. Thereafter, the arrangement section is shifted to the holding position, whereby the component is securely held by the holding parts.

According to a second aspect of the present invention, there is provided the component holder body as defined in the first aspect, wherein the holder body is constituted of a plurality of holder units coupled to one another, each of the holder units comprising the component arrangement section and the holding parts and further comprising coupling parts at both side edges thereof, wherein the component arrangement section is disposed inside a peripheral frame of the holder unit, and at least one of a pair of confronting side edges of the component arrangement section is coupled with an inner edge of the peripheral frame facing the side edge by means of self hinges via a link, with the holding part being integrally extended from the link.

According to a third aspect of the present invention, there is provided the component holder body as defined in the first aspect, wherein the holder body is constituted of a plurality of holder units coupled to one another, each of the holder units comprising the component arrangement section and the holding parts and further comprising coupling parts at both side edges thereof, wherein both ends of a pair of links coupled via a first self hinge are coupled via second self hinges with inner edges of a peripheral frame facing each other, and the component arrangement section is provided at a central part including a coupled portion of the pair of the links, with the holding parts being integrally extended from the pair of the links.

According to the arrangements of the second and third aspects, when the holder unit is formed by injection molding, the holder unit can be molded accurately, thereby holding the component more surely. Since the arrangement section is coupled to the peripheral frame by the links and self hinges, this smoothly and stably shifts the arrangement section between two positions and ensures long-time use.

According to a fourth aspect of the present invention, there is provided the component holder body as defined in the second or third aspect, wherein the coupling part is constituted of a coupling hole formed at one side edge of the peripheral frame, an engaging projection projecting at the other side edge of the peripheral frame to be fitted in the coupling hole, and an engaging hook projecting at a side face of the engaging projection to be engaged with a peripheral edge portion of the coupling hole in a state while the engaging projection is inserted into the coupling hole.

When the coupling part is constituted of the coupling hole formed at one side edge of the peripheral frame, the engaging projection projecting at the other side edge of the peripheral frame to be inserted into the coupling hole and the engaging hook projecting at the side face of the engaging projection to be engageable with the peripheral edge portion of the coupling hole when the engaging projection is inserted into the coupling hole, the holder units can be coupled easily and not separated unexpectedly. Accordingly, the holder unit can be used with high reliability.

According to a fifth aspect of the present invention, there is provided the component holder body as defined in the first aspect, wherein the component arrangement section is constituted of a recessed portion formed in an elastically deformable tape body, the tape body being elastically shiftable between a sinking state from one face of the tape body and a projecting state, and each of the holding parts is constituted of a part of an outer peripheral portion of a wall forming the recessed portion which is turned up therefrom.

Even when the recessed portion, elastically shiftable between the sinking state from one face of the tape body and the projecting state, is formed in the elastically deformable tape body, thereby constituting the arrangement section, and the part of the outer peripheral portion of the wall forming the recessed portion is turned up to form the holding part, the holder unit can surely hold and repeatedly store/take out the component similar to the above in a simple manipulation. Moreover, the holder unit can be reused as it is.

BRIEF DESCRIPTION OF THE DRAWINGS

These and other aspects and features of the present invention will become clear from the following description taken in conjunction with the preferred embodiments thereof with reference to the accompanying drawings, in which:

FIG. 13 is a plan view showing the component holder body of FIG. 12;

DETAILED DESCRIPTION OF THE PREFERRED EMBODIMENTS

Figure 1:
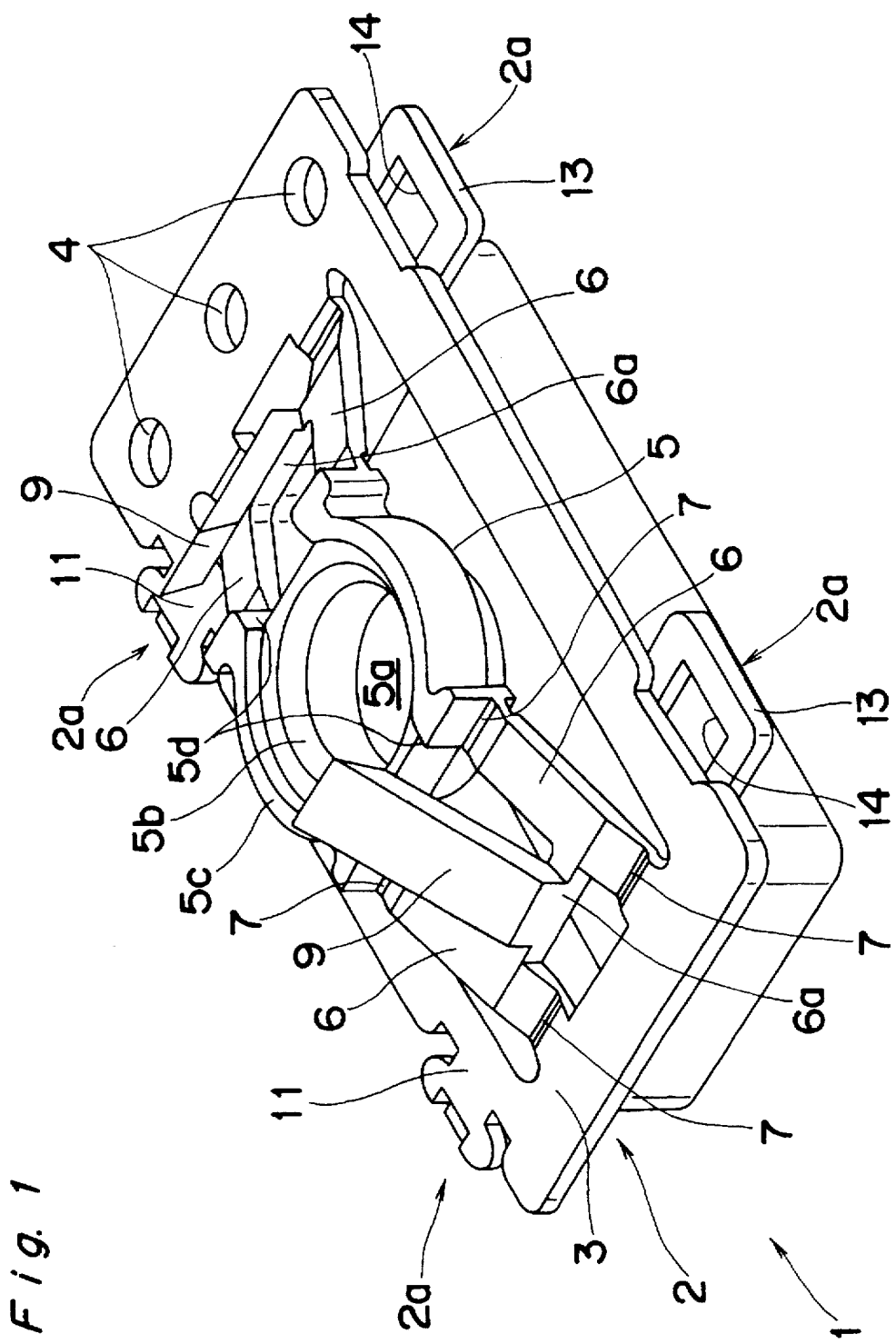
FIG. 1 is a perspective view showing a holder unit of a component holder body according to a first embodiment of the present invention.

Before the description of the present invention proceeds, it is to be noted that like parts are designated by like reference numerals throughout the accompanying drawings.

Figure 2:
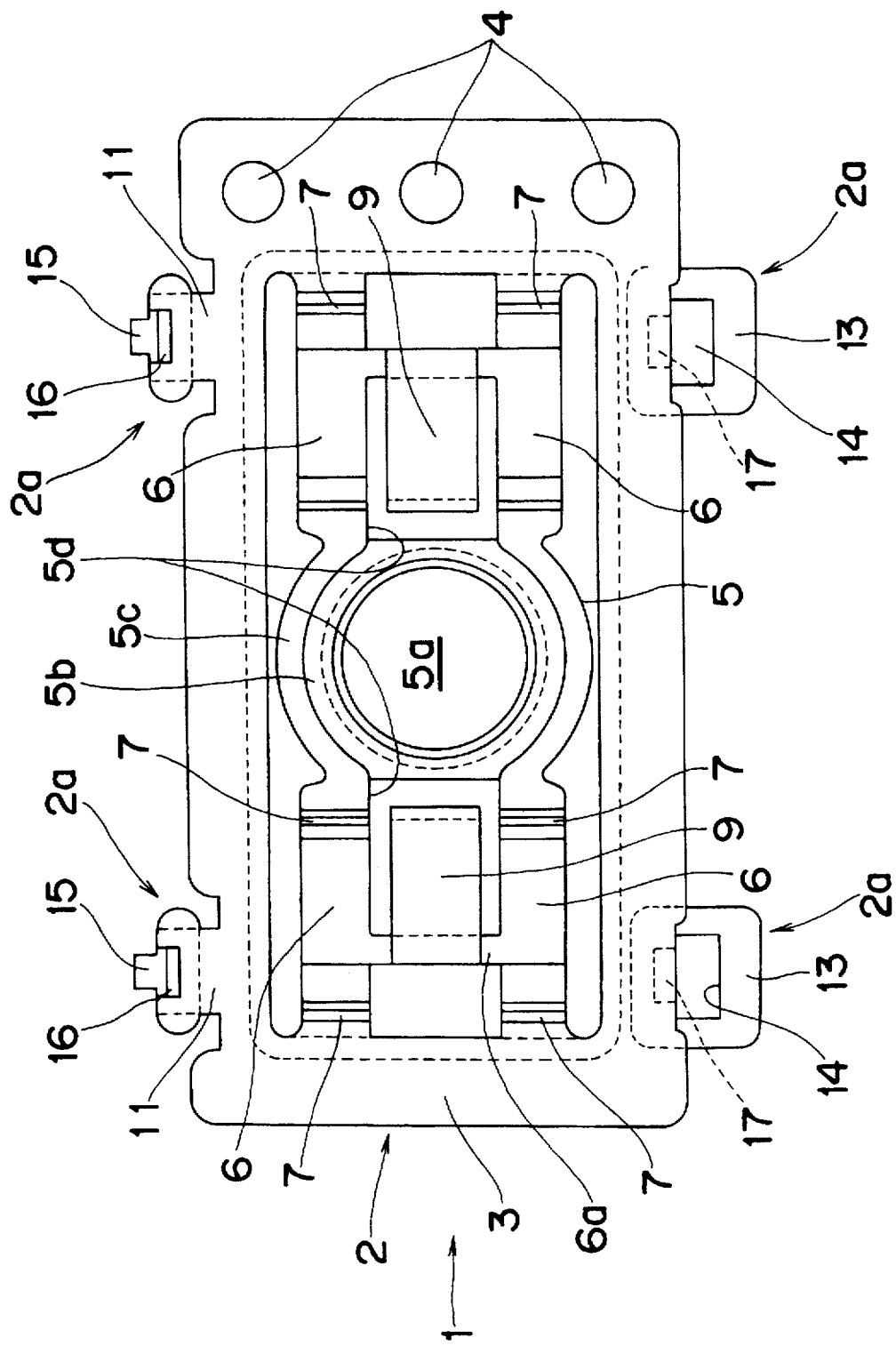
FIG. 2 is a plan view of the holder unit in the first embodiment.

A component holder body in one embodiment of the present invention will be described with reference to FIGS. 1-3.

Reference numeral 2 is a holder unit. Many holder units 2 are coupled at coupling parts 2a at both sides thereof, thereby constituting a component holder body 1. Each holder unit 2 stores/holds a component thereinside. A tape-like collective body of components is thus formed.

The holder unit 2 is formed of polypropylene or polyethylene by injection molding into a nearly rectangular shape in a plan view, specifically, longer in a direction orthogonal to a coupling direction thereof. The holder unit 2 has a peripheral frame 3 of an inverted L in a cross section, and feed holes 4 via a predetermined pitch at one side portion in parallel to the coupling direction.

Figure 3A:
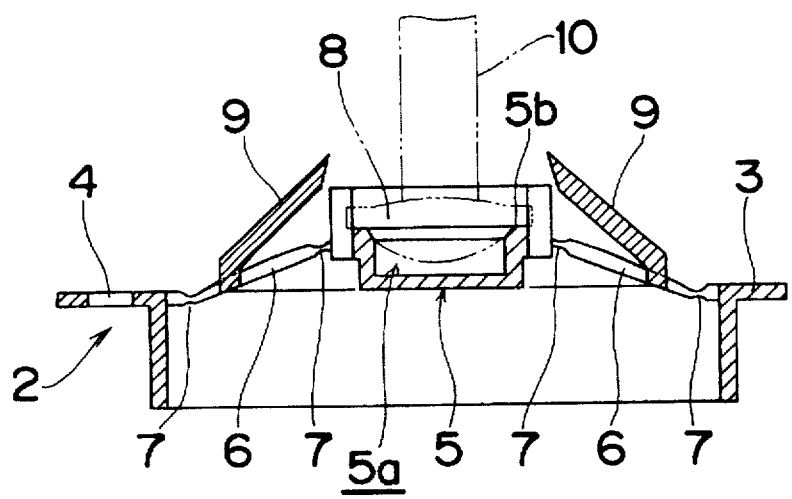
FIGS. 3A and 3B are a longitudinal sectional front view showing the operating state of the holder unit in the first embodiment when a component arrangement section is located at a projecting position, and a longitudinal sectional front view showing the operating state of the holder malt when the component arrangement section is present at a holding position.
Figure 3B:
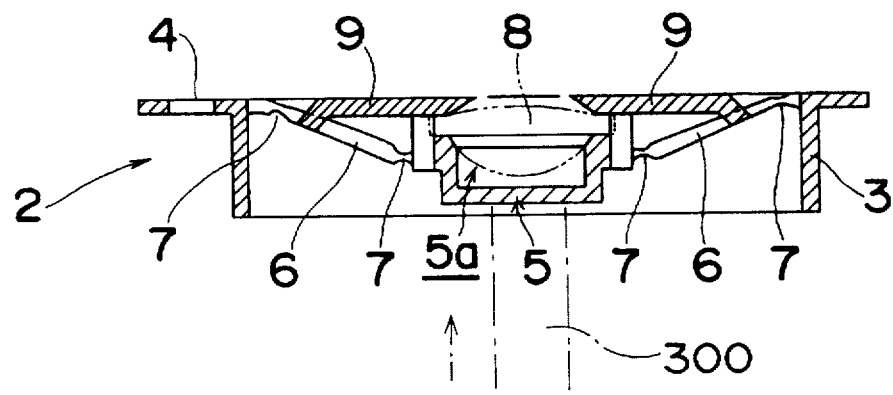
Figure 4:
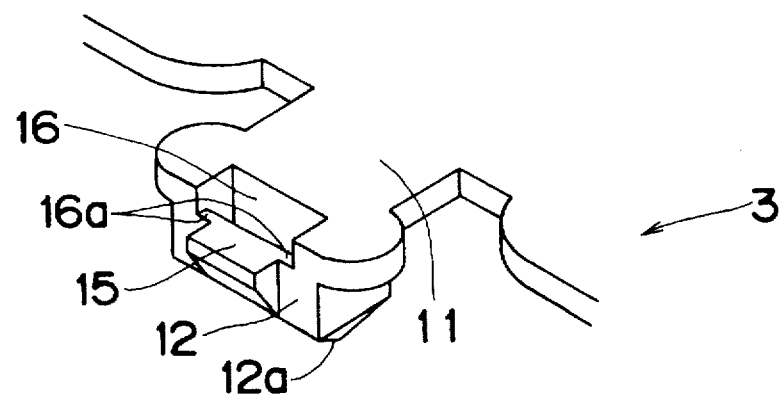
FIG. 4 is a perspective view showing an engaging projection of a coupling portion of the holder unit in the first embodiment.

A component arrangement section 5 is provided inside the peripheral frame 3, which forms an installation space 5a for a component. Self hinges 7 couple each of a pair of confronting side edges of the component arrangement section 5 confronting in the direction orthogonal to the coupling direction at an intermediate position in a vertical direction of the section, with an upper end of an inner edge of the peripheral frame 3 facing the side edge, via a pair of parallel links 6. The length of the link 6 is set to be slightly larger than half a distance obtained by subtracting the distance of the pairing side edges of the arrangement section 5 from the distance of inner edges of the peripheral frame 3. The component arrangement section 5 is consequently rendered shiftable between a holding position located lower than an upper surface of the peripheral frame 3 as shown in FIG. 3B and a projecting position projecting up from the upper surface of the peripheral frame 3 as shown in FIG. 3A. For instance, when a component 8 like a lens as shown by a virtual line in FIG. 3 is to be stored, the component arrangement section 5 is shaped into a bottomed, schematically cylindrical form, with having a supporting step portion 5b at a middle position in a heightwise direction, a large-diameter cylindrical portion 5c over the supporting step portion 5b to be outfitted in the outer periphery of the component, and notched portions 5d at both sides of the cylindrical portion 5c to which holding parts 9 to be described in the following are inserted.

The pair of links 6, 6 arranged in parallel are coupled at a coupling part 6a into one body. The holding part 9 referred to hereinabove is integrally extended slightly slantwise upward to the pair of links 6 from the coupling part 6a to hold the component 8 set in the arrangement section 5. Interlocking with the shift of the arrangement section 5 between the projecting position and holding position as shown in FIGS. 3A and 3B while the links 6 oscillate up and down, the holding parts 9 shift between a retreat posture where the holding parts 9 are opened up and a holding posture for holding the component 8.

A pair of male coupling elements 11 spaced a suitable distance from each other project at one side edge of the peripheral frame 3 of the coupling direction. An engaging projection 12 projects upward at a front end part of the coupling element 11. At the other side edge of the peripheral frame 3 in the coupling direction, a pair of projecting female coupling portions 13 are formed at positions corresponding to the coupling elements 11. A coupling hole 14 is formed in the projecting portion 13 into which the engaging projection 12 is fitted. A coupling part 2a is constituted of the engaging projection 12 and the coupling hole 14. The engaging projection 12 has a sharp projecting portion 12a at the lower end thereof and an engaging hook 15 projecting at an outer face thereof. A cave portion 16 of a larger width than that of the engaging hook 15 is formed inside the engaging hook 15 and both the ends of the engaging hook 15 and the side end walls of the cave portion 16 are connected to each other via thin connection walls 16a, so that the engaging hook 15 is let to sink into the cave portion 16 by the application of a suitable external and force and or is subsequently restored. A face 17 at a peripheral side face of the coupling hole 14 corresponding to the engaging hook 15 is engaged with the engaging hook 15 when the engaging projection 12 is completely fitted into the coupling hole 14.

Figure 5A:
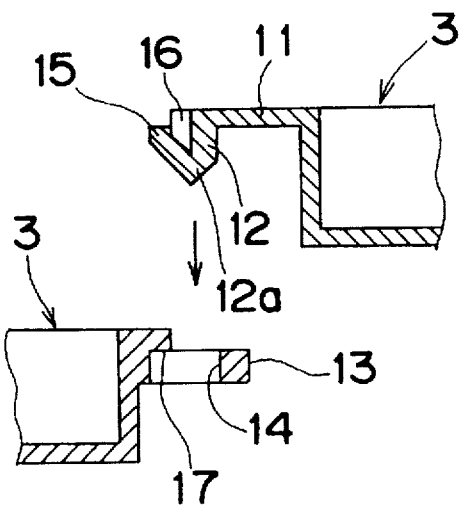
FIGS. 5A, 5B, and 5C are cross-sectional views showing states where the engaging projection of the coupling portion is engaged into a coupling hole thereof in the first embodiment.
Figure 5B:
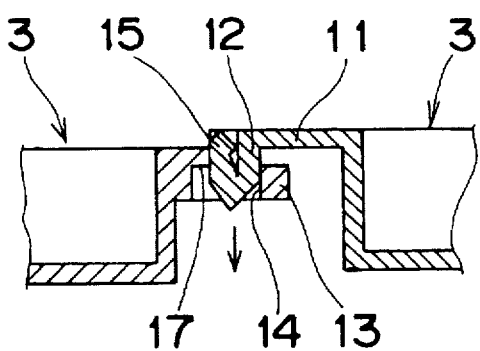
Figure 5C:
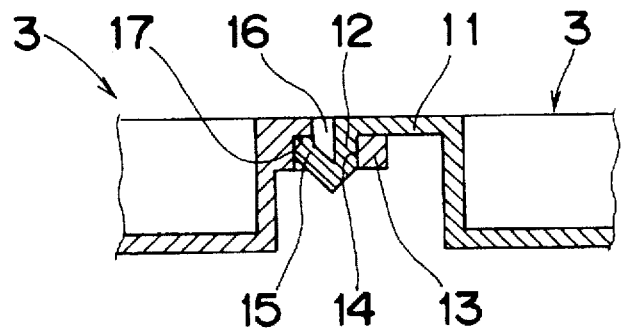

For coupling the holder units 2 one to another, as shown in FIGS. 5A–5C, the coupling hole 14 of one holder unit 2 is positioned below the engaging projection 12 of the other holder unit 2, then the other holder unit 2 is descended thereby to insert the engaging projection 12 of the other holder unit 2 into the coupling hole 14 of the one holder unit 2. As a result, the engaging hook 15 is returned after retreated into the cave portion 16, and engaged with the face 17 formed at one side face of the coupling hole 14 of the one holder unit 2. Accordingly, the engaging projection 12 is prevented from slipping out of the coupling hole 14 and the holder units 2 are surely coupled with each other. Due to the engaging hook 15 provided at the engaging projection 12, the holder units 2 can be easily coupled so as to be separated unexpectedly from each other simply by inserting the engaging projection 12 into the coupling hole 14.

The operation to insert, hold, and take out the component 8 to the component holder body 2 constituted as above will now be discussed. In order to insert and hold the component 8 in the holder unit 2, first, the component arrangement section 5 is pressed from below by an appropriate push means such as a bar 300 in FIG. 3B to the projecting position, as indicated in FIG. 3A. The holding parts 9 are moved into the retreat posture thereby opening the installation space 5a. In this state, the component 8 held by a suction nozzle 10 or the like is inserted from above into the component arrangement section 5 which in turn is pressed down directly.

Thus, the component arrangement section 5 is positioned at the holding position, as shown in FIG. 3B. At the same time, the holding parts 9 enter the notched portions 5d thereby to hold the component 8 from above, so that the component 8 is tightly held and does not to move in this manner.

In order to take out the component 8, similarly, the component arrangement section 5 is pushed from below by the suitable push means 300 from the state of FIG. 3B up to the projecting position shown in FIG. 3A. Then, the component 8 is caught and taken out by the suction nozzle 10 or the like. At this time, in a case where it seems that there is a danger that the component 8 held in the component arrangement section 5 might pop up therefrom because the component 8 is moved from the holding position to the projecting position to some great extent, it is better that the suction nozzle 10 is positioned as shown by the dotted lines in FIG. 3A so as to receive the component 8 moved from the holding position to the projecting position by the lower end of the suction nozzle 10.

According to the instant embodiment, the holding parts 9 are brought into the retreat posture by shifting the component arrangement section 5 to the projecting position, and the component 8 is arranged at the arrangement section 5 from above. Subsequently, the component arrangement section 5 is shifted to the holding position, whereby the component 8 is surely held by the holding parts 9. Since the holder unit 2 is formed by injection molding, that is, can be molded with good accuracy, the component 8 can be held even more surely. Moreover, since the arrangement section 5 is coupled to the peripheral frame 3 by the links 6 and self hinges 7, the arrangement section 5 is allowed to shift between the two positions smoothly and stably and is able to endure long-time use.

The holder unit 2 is molded while the component arrangement section 5 is positioned at the projecting position as in FIGS. 1–3A so as not to overlap with the holding parts 9 in a plan view and not to interfere with each other.

Figure 6:
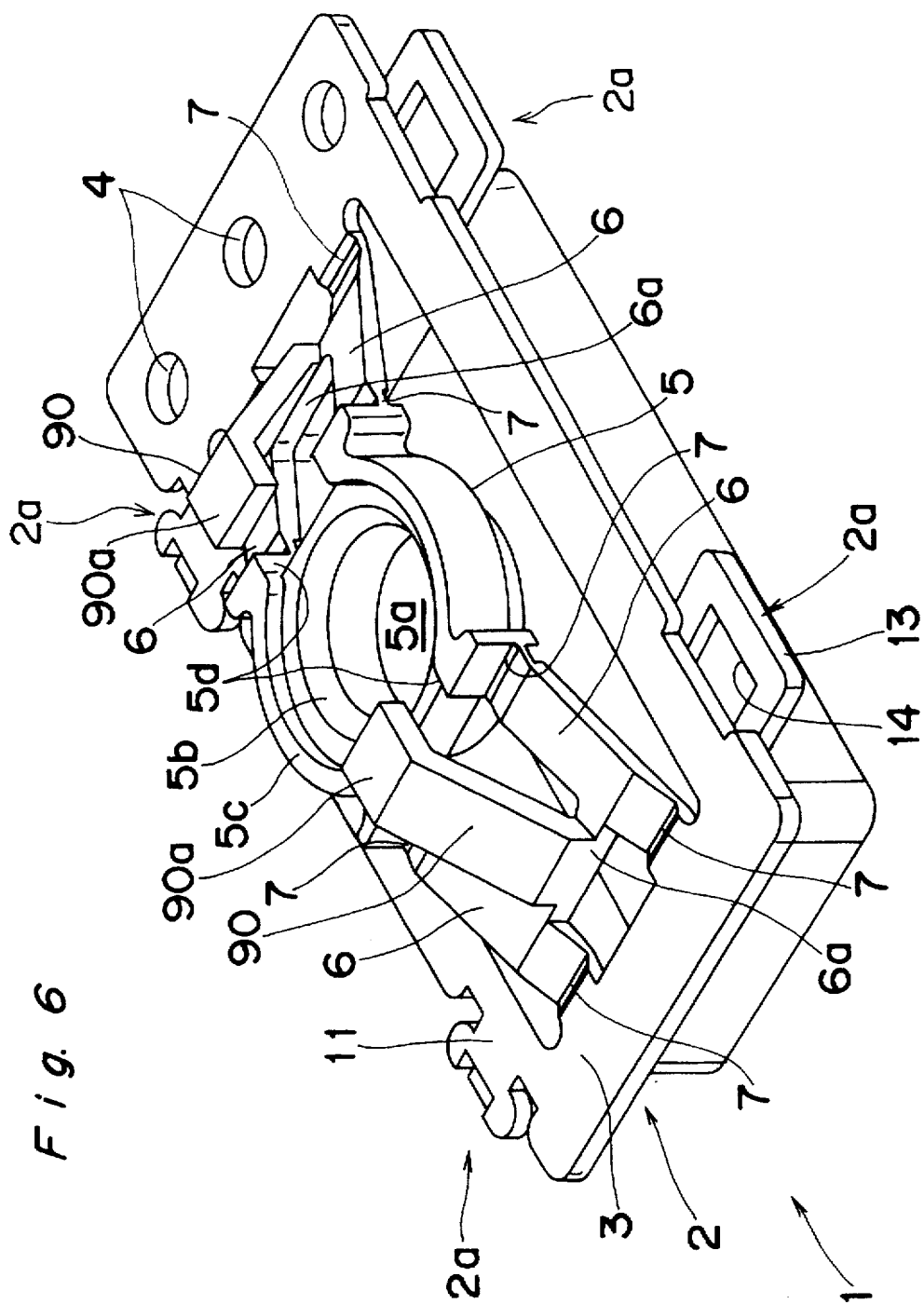
FIG. 6. is a perspective view showing a holder unit of a component holder body according to a second embodiment of the present invention.
Figure 7:
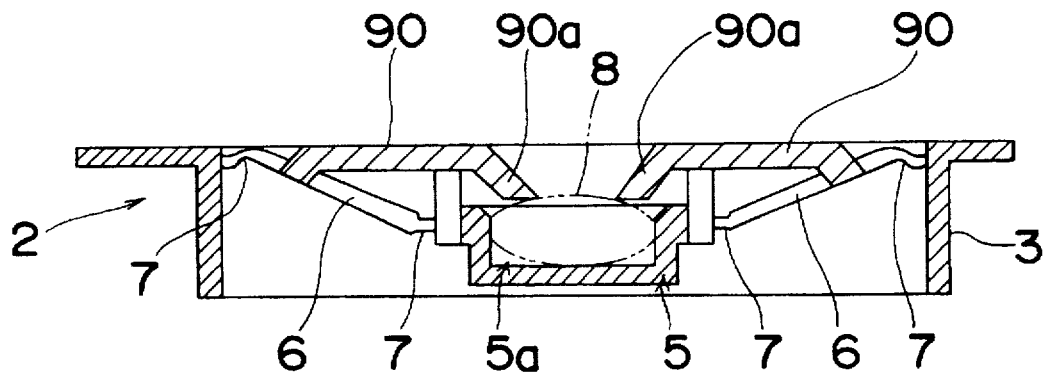
FIG. 7 is a cross-sectional view of the holder unit in the second embodiment.

Although each of the holding portions 9 has a flat plate in the first embodiment in FIGS. 1–3B, as a second embodiment of the present invention, each of holding portions 90 can have a bent portion 90a at the front end of the main body 90 as shown in FIGS. 6 and 7 so that a flatter component 8 is pressed by the bent portions 90a of the holding portions 90 in the component arrangement section 5 at the holding position. That is, the configuration of the holding portion can be formed in accordance with the configuration of a component to be held in the component arrangement section 5.

In the first embodiment, a pair of links 6 is arranged at each side of the component arrangement section 5. It is needless to say, however, that as a third embodiment of the present invention, a wide single link 60 will do if the link 30 is disposed at each side of the arrangement section 5 in a manner not to incline the arrangement section 5 in a widthwise direction of the link 60. Still, a pair of links 6 is more preferable so that the link 6 does not overlap with the holding part 9 in a plan view at the molding occasion.

Figure 9A:
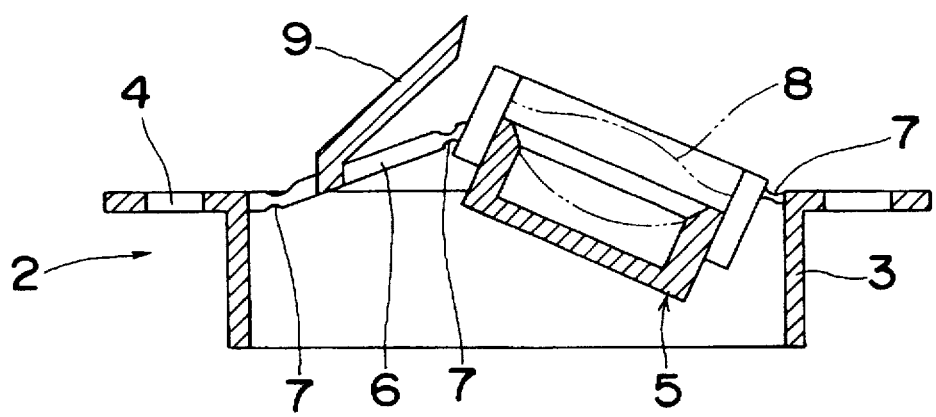
FIGS. 9A and 9B are a longitudinal sectional front view showing the operating state of a holder unit of a component holder body according to a fourth embodiment of the present invention when a component arrangement section is located at a projecting position, and a longitudinal sectional front view showing the operating state of the holder unit when the component arrangement section is present at a holding position.
Figure 9B:
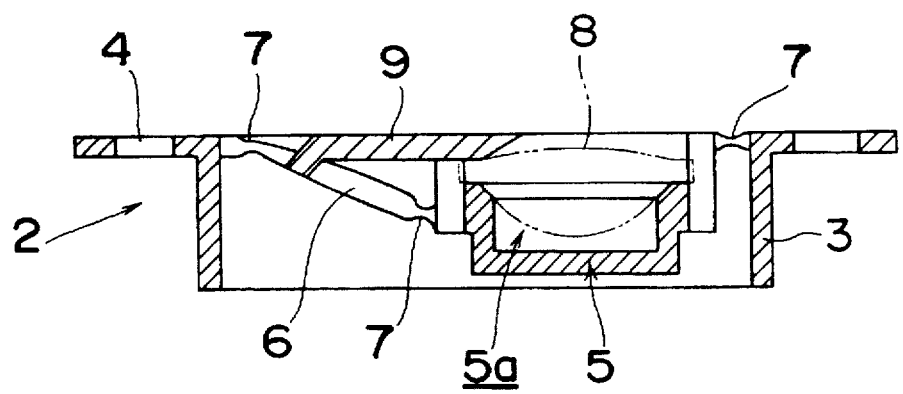
Figure 8:
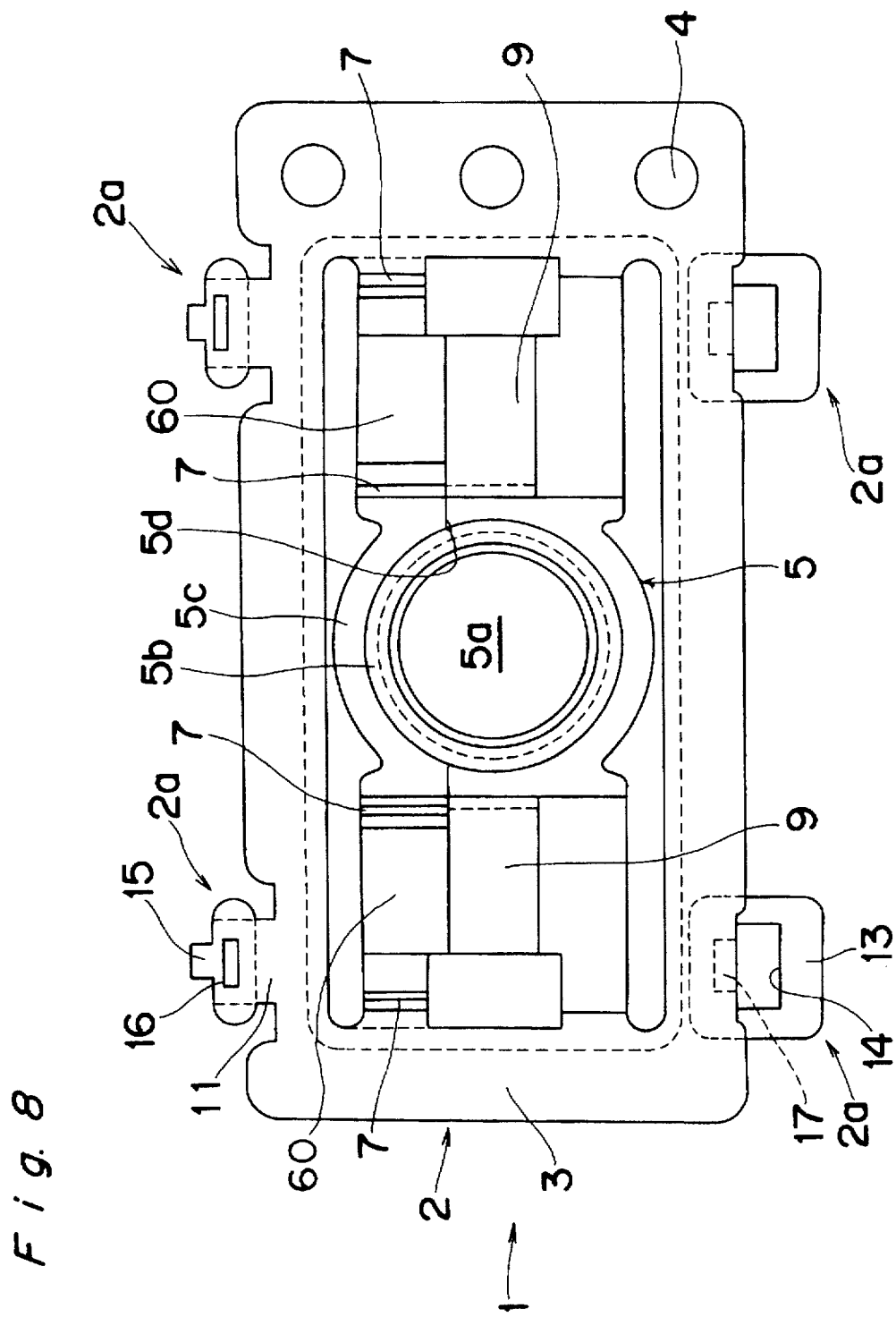
FIG. 8 is a plan view showing a holder unit of a component holder body according to a third embodiment of the present invention.

Alternatively, as shown in FIGS. 9A and 9B as a fourth embodiment of the present invention, the component arrangement section 5 may be coupled only at one side (right side in FIGS. 9A and 9B) thereof with the confronting inner edge of the peripheral frame 3 by the self hinges 7 via the links 6, while the component arrangement section 5 is directly coupled at the other side (left side in FIGS. 9A and 9B) thereof with the inner edge of the peripheral frame 3 by the self hinge 7. This achieves the same effect.

Figure 10:
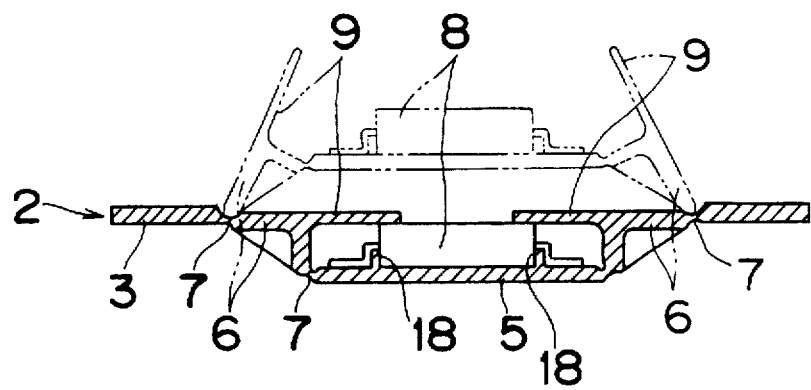
FIG. 10 is a longitudinal sectional front view of a holder unit of a component holder body according to a fifth embodiment of the present invention.
Figure 11:
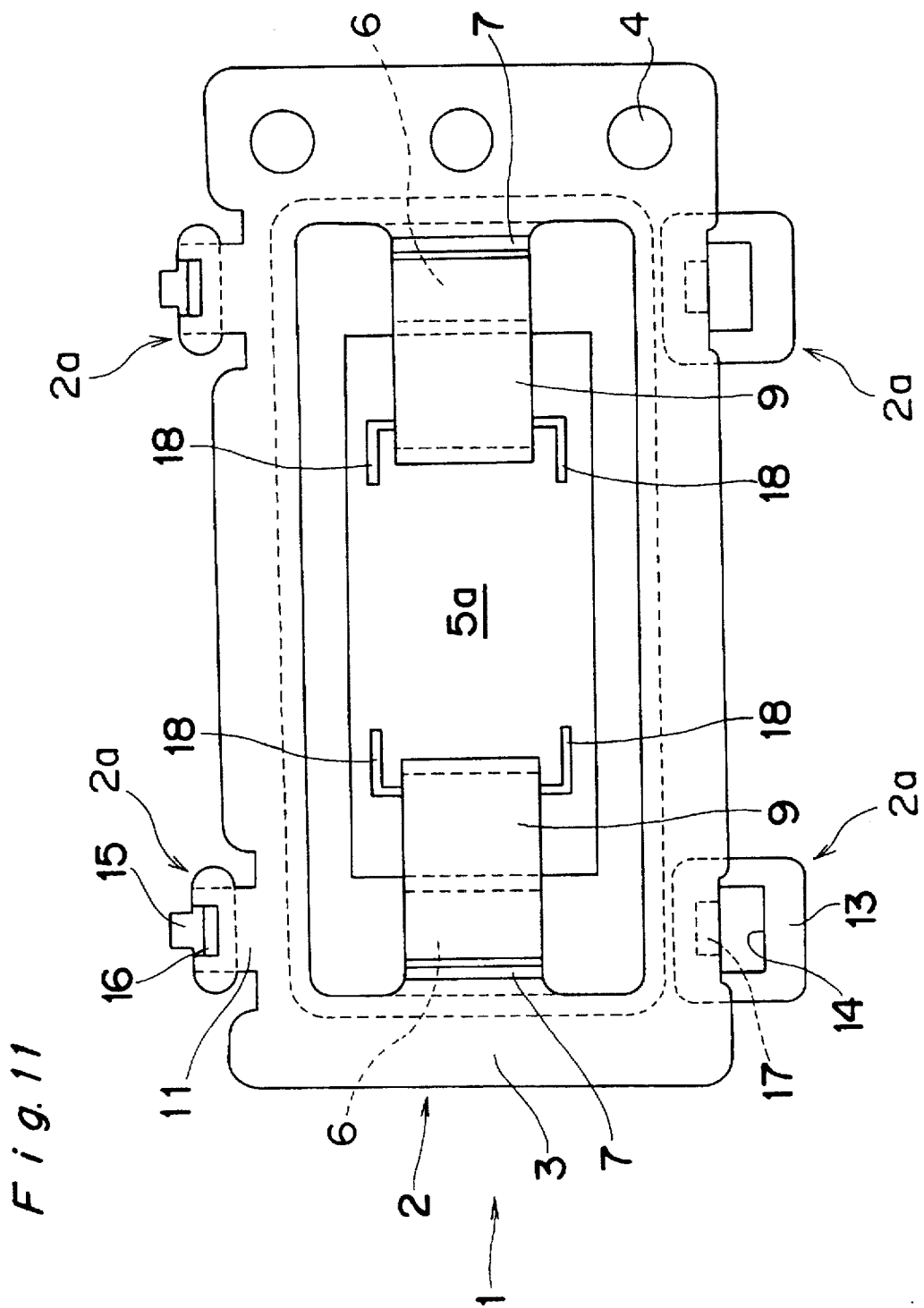
FIG. 11 is a plan view showing the holder unit in the fifth embodiment.

A fifth embodiment of the component holder body of the present invention will be described with reference to FIGS. 10 and 11. The fifth embodiment is basically equal to the first embodiment and simply the shape of the component arrangement section 5, etc. is different. More specifically, the component arrangement section 5 is obtained by projecting L-shaped frames 18 for positioning a rectangular component 8 at a central portion of a flat bottom plate. The link 6 is an inverted L in a cross section, from a corner of which the holding part 9 is extended. The component holder body of the fifth embodiment works the same operation as the above first embodiment.

Figure 12:
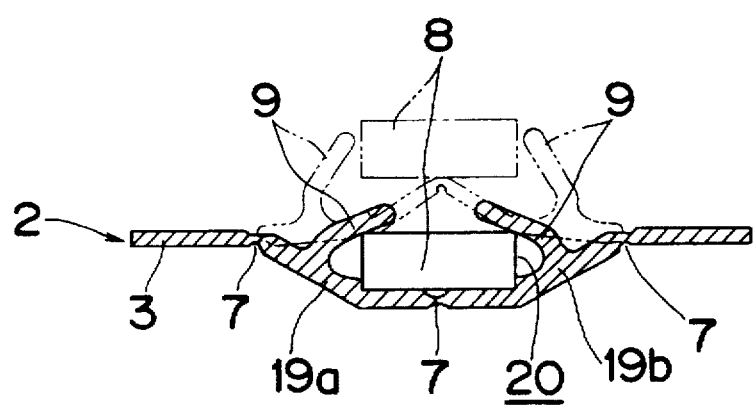
FIG. 12 is a longitudinal sectional front view of a holder unit of a component holder body according to a sixth embodiment of the present invention.

A component holder body according to a sixth embodiment of the present invention will be depicted with reference to FIGS. 12 and 13. Both ends of a pair of links 19a, 19b coupled via the self hinge 7 are coupled via self hinges 7 to the inner edges of the peripheral frame 3 confronting each other. A component arrangement section 20 is defined at a central part including the coupled portion of the pair of links 19a, 19b, and the holding part 9 is integrally extended from each link 19a, 19b.

In this sixth embodiment alike, the component arrangement section 20 can shift between the holding position indicated by solid lines and the projecting position indicated by virtual lines when the pair of links 19a, 19b oscillate up and down. At the same time, the holding parts 9 shift between the holding posture and retreat posture, with nearly the same effect attained as in the above embodiments.

Figure 14A:
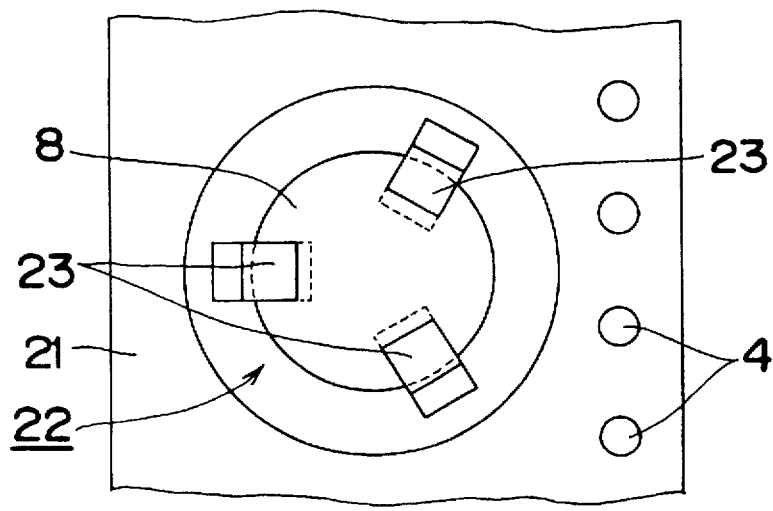
FIG. 14A and 14B are a partial plan view and a longitudinally sectional front view showing a component holder body according to a seventh embodiment of the present invention.
Figure 14B:
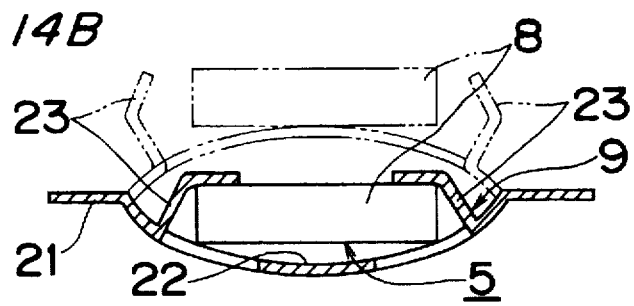
Figure 15:
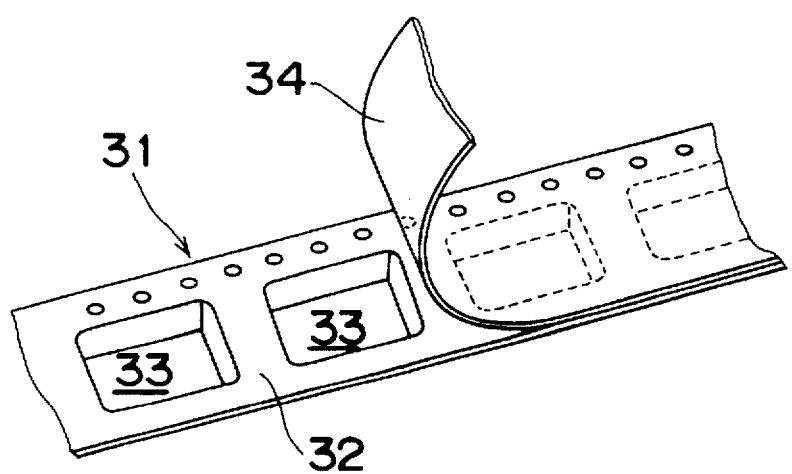
FIG. 15 is a perspective view of a conventional component holder body.

A component holder body according to a seventh embodiment of the present invention will be depicted with reference to FIGS. 14A and 14B. Many injection-molded holder units 2 are coupled thereby to constitute the component holder body 1 in any of the foregoing embodiments. On the other hand, according to the seventh embodiment, an elastic deformable tape body 21 is used, and a recessed portion 22 is formed in the tape body 21. The recessed portion 22 is elastically shiftable between a state sinking from one face of the tape body 21 and a state projecting from the face. This recessed portion 22 serves as the component arrangement section 5. Moreover, cut and turned-up elements 23 are formed at a plurality of points (three points in the illustrated example) of an outer peripheral portion of a wall forming the recessed portion 22, which constitute the holding part 9.

Also in the seventh embodiment, when the recessed portion 22 is in the sinking state shown by solid lines, the component 8 is set at the component arrangement section 5 constituted of the recessed portion 22 and held by the holding part 9 consisting of the turned-up elements 23. When the recessed portion 22 is projected up as indicated by virtual lines, the holding parts 9 cut and turned up from the wall are brought into the retreat posture to open an upper part of the component arrangement section 20. Substantially the same effect as in the foregoing embodiments is accordingly achieved.

As is made clear from the above description, according to the component holder body of the present invention, the component arrangement section constituting the installation space for a component is adapted to shift between the holding position and the projecting position projecting up from the holding position. The holding parts are designed to shift between the holding posture for holding the component and the retreat posture for opening the installation space, in association with the shift of the component arrangement section between the holding and projecting positions. Accordingly, the component can be set or taken out from above to the component arrangement section at the projecting position, and moreover surely held by the holding parts by shifting the component arrangement section to the holding position. Since the total holder body is reusable, costs for feeding of components can be decreased.

The component holder body is formed by coupling a plurality of holder units which have coupling parts at both side edges thereof. The holder unit has the component arrangement section inside the peripheral frame thereof. The component arrangement section is coupled with the inner edges of the peripheral frame by the self hinges via the links. Moreover, the holding parts are integrally extended from the links. In the constitution of the holder unit as above, the holder unit can be formed with good accuracy by injection molding, thereby more surely holding the component. Since the component arrangement section is coupled with the peripheral frame by the links and self hinges, the component arrangement section can shift smoothly between the two positions and can be used stably for a long time.

When both ends of a pair of links coupled each other via a self hinge are coupled via self hinges with the inner edges of the peripheral frame opposite to each other, the component arrangement section is provided at the central part including the coupled portion of the links and the holding parts are integrally extended from the links, the same effect is realized.

If the coupling part is constituted of the coupling hole at one side edge of the peripheral frame, the engaging projection at the other side edge of the peripheral frame to be fitted in the coupling hole and, the engaging hook projecting at the side face of the engaging projection to be engageable with the peripheral edge portion of the coupling hole when the engaging projection is inserted into the coupling hole, the holder units can be coupled easily with each other and not separated unexpectedly. Highly reliable use is ensured.

When the recessed portion is formed, as the component arrangement section, to be elastically shiftable between the sinking state and projecting state from one face of the elastically deformable tape body and a part of the outer peripheral portion of the wall forming the recessed portion is cut and turned up to form the holding part, the component holder body can surely hold and repeatedly accommodate/take out the component similar to the above in a simple manipulation and moreover can be reused directly as it is.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A component holder body comprising:

a peripheral frame having opposing first and second inner edge surfaces;

a component holding structure disposed within said peripheral frame and having opposite first and second sides attached to said opposing first and second inner edge surfaces of said peripheral frame, said component holding structure defining an installation space for a component;

a first link connecting said first side of said component holding structure to said first inner edge surface of said peripheral frame, wherein said first link connects said component holding structure and said peripheral frame via a first pair of integral hinges; and a first holding part, extending integrally from said first link, for holding a component in said installation space, wherein said component holding structure is movable relative to said peripheral frame between a holding position, at which said holding part assumes a component securing position, and a projecting position, at which said component holding structure is disposed upward relative to said peripheral frame and said holding part assumes a component removal/insertion position.

2. The component holder body as claimed in claim 1, further comprising:

at least one male coupling member projecting from a first outer peripheral edge of said peripheral frame; and at least one female coupling member projecting from a second outer peripheral edge of said peripheral frame, wherein said first and second outer peripheral edges are disposed on opposite sides of said peripheral frame.

3. The component holder body as claimed in claim 1, further comprising:

a pair of male coupling members projecting from a first outer peripheral edge of said peripheral frame; and a pair of female coupling members projecting from a second outer peripheral edge of said peripheral frame, wherein said first and second outer peripheral edges are disposed on opposite sides of said peripheral frame.

4. The component holder body as claimed in claim 3, wherein:

each of said female coupling members comprise a projection defining a through hole; and each of said male coupling members comprise an engaging projection and an engaging hook projecting from a side face of said engaging projection for engaging a peripheral edge portion of a coupling hole while said engaging projection is inserted therein.

5. The component holder body as claimed in claim 1, further comprising a second link disposed in parallel to said first link and connecting said first side of said component holding structure to said first inner edge surface of said peripheral frame, wherein said second link connects said component holding structure and said peripheral frame via a second pair of integral hinges.

6. The component holder body as claimed in claim 5, further comprising:

third and fourth links each connected to said second side of said component holding structure and to said second inner edge surface of said peripheral frame, wherein said third and fourth links are disposed in parallel to each other and connect said component holding section and said peripheral frame via a third and fourth pair of integral hinges, respectively; and a second holding part, extending integrally from said third and fourth links, for holding a component in said installation space.

7. The component holder body as claimed in claim 1, further comprising a second link connecting said second side of said component holding structure to said second inner edge surface of said peripheral frame, wherein said second link connects said component holding structure and said peripheral frame via a second pair of integral hinges.

8. The component holder body as claimed in claim 5, further comprising:

at least one male coupling member projecting from a first outer peripheral edge of said peripheral frame; and at least one female coupling member projecting from a second outer peripheral edge of said peripheral frame, wherein said first and second outer peripheral edges are disposed on opposite sides of said peripheral frame.

9. The component holder body as claimed in claim 5, further comprising:

a pair of male coupling members projecting from a first outer peripheral edge of said peripheral frame; and a pair of female coupling members projecting from a second outer peripheral edge of said peripheral frame, wherein said first and second outer peripheral edges are disposed on opposite sides of said peripheral frame.

10. The component holder body as claimed in claim 9, wherein:

each of said female coupling members comprise a projection defining a through hole; and each of said male coupling members comprise an engaging projection and an engaging hook projecting from a side face of said engaging projection for engaging a peripheral edge portion of a coupling hole while said engaging projection is inserted therein.

11. A component holder assembly including a plurality of interconnected component holding bodies, each of said component holding bodies comprising:

a peripheral frame having opposing first and second inner edge surfaces;

a component holding structure disposed within said peripheral frame and having opposite first and second sides attached to said opposing first and second inner edge surfaces of said peripheral frame, said component holding structure defining an installation space for a component;

a first link connecting said first side of said component holding structure to said first inner edge surface of said peripheral frame, wherein said first link connects said component holding structure and said peripheral frame via a first pair of integral hinges; and at least one holding part, extending integrally from said link, for holding a component in said installation space, wherein said component holding structure is movable via said link between a holding position, at which said holding part assumes a component securing posture, and a projecting position, at which said component holding structure is disposed upward relative to said peripheral frame and said holding part assumes a component removal/insertion position.

12. The component holder assembly as claimed in claim 11, wherein each of said component holding bodies further comprises:

a female coupling part disposed on a first outer side edge of said peripheral frame; and a male coupling part disposed on a second outer side edge of said peripheral frame, said second outer side edge being opposite said first outer side edge, wherein said component holding bodies are interconnected by inserting said male coupling part of one of said component holding bodies downwardly into said female coupling part of an adjacent one of said component holding bodies.

13. The component holder assembly as claimed in claim 12, wherein:

each of said female coupling members comprise a projection defining a through hole; and each of said male coupling members comprise an engaging projection and an engaging hook projecting from a side face of said engaging projection for engaging a peripheral edge portion of a coupling hole while said engaging projection is inserted therein.

14. A component holder assembly comprising:

an elastically deformable tape;

a plurality of recessed portions formed in said tape body, each of said recessed portions including a plurality of turned up elements cut from said elastically deformable tape, said turned up elements are equally spaced along an outer peripheral wall of said recessed portion so as to define component holding members, wherein each of said recessed portions is elastically shiftable between a first position in which said recessed portion is located below an upper surface of said elastically deformable tape and said holding members are in a component holding position, and a second position in which said recessed portion projects above the upper surface of said elastically deformable tape and said holding members are pivoted from said component holding position to an open position.

* * * * *